US011347340B2

(12) United States Patent
Lee et al.

(10) Patent No.: US 11,347,340 B2
(45) Date of Patent: May 31, 2022

(54) DISPLAY DEVICE

(71) Applicant: LG Display Co., Ltd., Seoul (KR)

(72) Inventors: Sangmin Lee, Paju-si (KR); JungRok Lee, Paju-si (KR); Dongwoo Kim, Paju-si (KR); Jiae Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/138,876

(22) Filed: Dec. 30, 2020

(65) Prior Publication Data

US 2021/0200367 A1 Jul. 1, 2021

(30) Foreign Application Priority Data

Dec. 31, 2019 (KR) .......................... 10-2019-0179313

(51) Int. Cl.
| | | |
|---|---|---|
| *G06F 3/045* | (2006.01) | |
| *G06F 3/041* | (2006.01) | |
| *G06F 3/044* | (2006.01) | |
| *G02F 1/1333* | (2006.01) | |
| *H01L 27/12* | (2006.01) | |

(52) U.S. Cl.
CPC ........ *G06F 3/0412* (2013.01); *G02F 1/13338* (2013.01); *G06F 3/044* (2013.01); *H01L 27/124* (2013.01)

(58) Field of Classification Search
CPC ........ G06F 3/041; G06F 3/0412; G06F 3/044; G02F 1/13338; G02F 1/134309; G02F 1/134318; G02F 1/134363; G02F 1/134372; G02F 1/136286; H01L 27/124
See application file for complete search history.

(56) References Cited

U.S. PATENT DOCUMENTS

| 10,712,852 | B2 * | 7/2020 | Yoshida | ............ G02F 1/136286 |
|---|---|---|---|---|
| 10,852,602 | B2 * | 12/2020 | Yoshida | ................ G02F 1/1309 |
| 11,107,842 | B2 * | 8/2021 | Chi | ........................ H01L 27/124 |
| 2016/0378233 | A1 * | 12/2016 | Huo | ...................... G06F 3/0412 |
| | | | | 345/174 |
| 2017/0153735 | A1 * | 6/2017 | Lee | ...................... G02F 1/13439 |
| 2017/0192569 | A1 * | 7/2017 | Jeon | .................... G06F 3/04164 |
| 2018/0188614 | A1 * | 7/2018 | Yeh | ................... G02F 1/134309 |
| 2019/0163322 | A1 * | 5/2019 | Lee | ........................ G06F 3/0418 |

FOREIGN PATENT DOCUMENTS

CN 108255355 B * 1/2021 ....... G02F 1/133345

* cited by examiner

*Primary Examiner* — Joe H Cheng
(74) *Attorney, Agent, or Firm* — Polsinelli PC

(57) ABSTRACT

A display device includes a plurality of sub-pixels defined by a plurality of gate lines and a plurality of data lines, a pixel electrode disposed in each of the sub-pixels in a first direction, a common electrode disposed in each of the sub-pixels in the first direction, and a sensing line disposed in each of the sub-pixels in the first direction, wherein the common electrode includes a first common electrode disposed at an outermost side in a second direction, the second direction is a direction perpendicular to the first direction, and the sensing line is disposed between the first common electrodes.

17 Claims, 12 Drawing Sheets

DISPLAY DEVICE

CROSS-REFERENCE TO RELATED APPLICATION

This application claims priority to and the benefit of Korean Patent Application No. 10-2019-0179313, filed on Dec. 31, 2019, which is hereby incorporated by reference in its entirety.

BACKGROUND

Field of the Disclosure

The present disclosure relates to a display device.

Description of the Background

As the information society develops, the demand for display devices for displaying images is increasing in various forms. Recently, various display devices such as liquid crystal display (LCD) devices, plasma display devices, and organic light emitting display (OLED) devices have been used.

By breaking from conventional input methods using buttons, keyboards, and mouses, the display devices provide touch-based input methods which allow users to easily input information or commands intuitively and conveniently. In order to provide the touch-based input method, it is necessary to check for the presence or absence of a user's touch and accurately detect touch coordinates.

In applying a touch screen to the display device, development in which a touch sensor is embedded in the display device is carried out. In particular, a display device using a common electrode formed on a lower substrate as a touch electrode has been developed.

However, there is a problem that an optical characteristic is degraded due to the common electrode (or the touch electrode).

SUMMARY

Accordingly, the present disclosure is directed to a display devise that substantially obviates one or more of problems due to limitations and disadvantages of the prior art.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

Further, the present disclosure provides a display device with an improved aperture ratio.

Further, the present disclosure provides a display device with improved transmittance.

According to an aspect of the present disclosure, a display device includes a plurality of sub-pixels defined by a plurality of gate lines and a plurality of data lines, a pixel electrode disposed in each of the sub-pixels in a first direction, a common electrode disposed in each of the sub-pixels in the first direction, and a sensing line disposed in each of the sub-pixels in the first direction, wherein the common electrode includes a first common electrode disposed at an outermost side in a second direction, the second direction is a direction perpendicular to the first direction, and the sensing line is disposed between the first common electrodes.

The sensing line may be disposed between the pixel electrodes adjacent to each other.

The common electrode may include a second common electrode disposed between the first common electrodes, the sensing line may overlap the second common electrode in a third direction, and the third direction may be a direction perpendicular to the first direction and the second direction.

Each of the sub-pixels may include a first area having a first separation distance between the second common electrodes adjacent to each other and a second area having a second separation distance that is smaller than the first separation distance between the second common electrodes adjacent to each other, and the sensing line may be disposed in the first area.

The sensing line may not overlap the second common electrode in the third direction, and the third direction may be a direction perpendicular to the first direction and the second direction.

The pixel electrode may be disposed to be spaced apart from the common electrode in the third direction, and the third direction may be a direction perpendicular to the first direction and the second direction.

The sensing line may overlap the common electrode and the pixel electrode in the third direction, and the third direction may be a direction perpendicular to the first direction and the second direction.

The pixel electrode may at least partially overlap the common electrode in the second direction.

BRIEF DESCRIPTION OF THE DRAWINGS

The above features and advantages of the present disclosure will become more apparent to those of ordinary skill in the art by describing exemplary aspects thereof in detail with reference to the attached drawings, in which.

DETAILED DESCRIPTION

Hereinafter, exemplary aspects of the present disclosure will be described in detail with reference to the accompanying drawings.

However, the technical spirit of the present disclosure is not limited to some aspects disclosed herein and may be implemented in various different forms. Within the scope of the technical spirit of the present disclosure, one or more of components may be selectively combined and substituted between aspects.

Further, unless explicitly defined and described, terms (including technical and scientific terms) used in the aspects of the present disclosure can be construed as a meaning that is generally understood by those skilled in the art to which the present disclosure pertains. The meanings of commonly used terms defined in the dictionary can be construed by considering the contextual meaning of the related technology.

Further, terms used in the aspects of the present disclosure are intended to describe the aspects and are not intended to limit the present disclosure.

In this disclosure, the singular forms may include the plural forms unless the context clearly dictates otherwise. When described as "at least one (or one or more) among A, B, and (or) C," it may include one or more of all combinations in which A, B, and C can be combined.

Further, in describing components of the aspect of the present disclosure, a first, a second, A, B, (a), (b), and the like can be used.

These terms are intended to distinguish one component from other components, but the nature and the order or sequence of the components is not limited by those terms.

Further, when a component is described as being "linked," "coupled," or "connected" to another component, the component is not only directly linked, coupled, or connected to another component, but also "linked," "coupled," or "connected" to another component with still another component disposed between the component and another component.

Further, when two components are described as being formed or disposed "on (above) or below (under)" of each component, "on (above) or below (under)" includes not only when the two components are in direct contact with each other, but also when one or more other components are formed or disposed between the two components. Further, when a component is described as being "on (above) or below (under)," the description may include the meanings of an upward direction and a downward direction based on one component.

Figure 1:
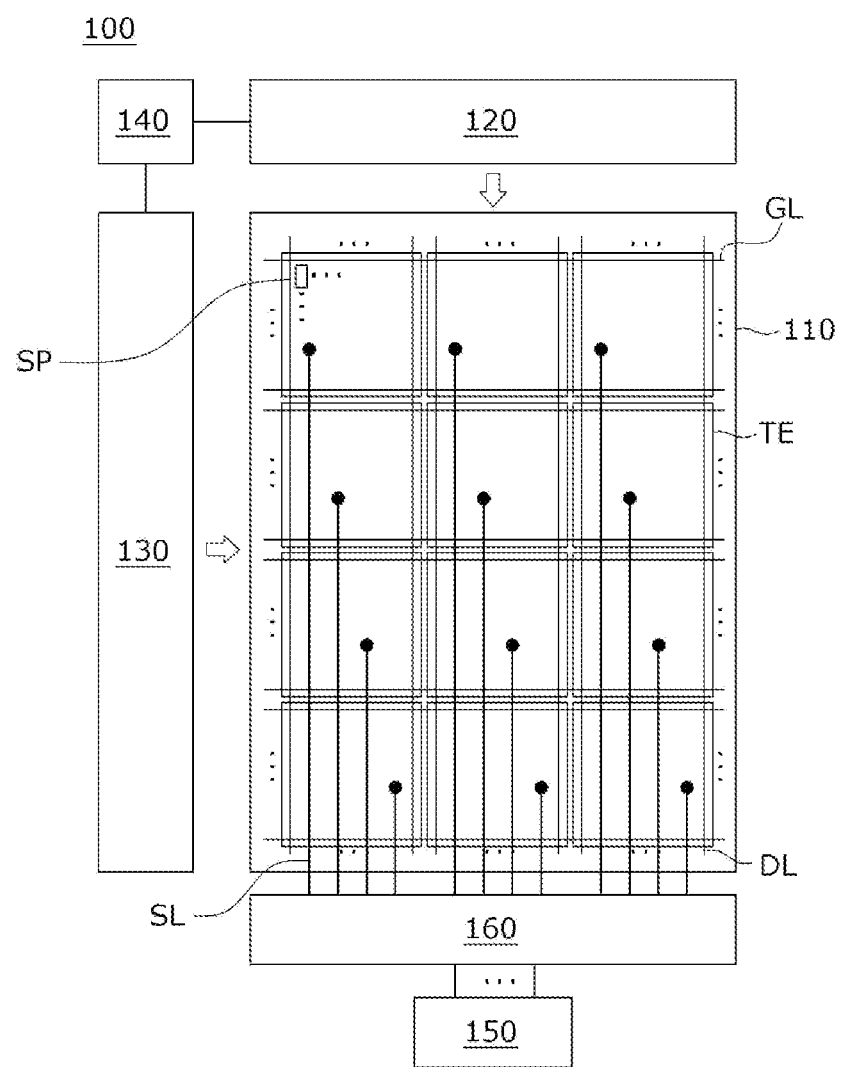
FIG. 1 is a block diagram illustrating a display device according to the present disclosure.

FIG. 1 is a block diagram illustrating a display device according to the present disclosure.

Referring to FIG. 1, a display device 100 according to the present disclosure may include a display panel 110, a data driver 120, a gate driver 130, and a controller 140. Further, the display device 100 may perform a display function.

In addition, the display device 100 may further include a data line DL connecting the data driver 120 and the display panel 110. Further, the display device 100 may further include a gate line GL connecting the gate driver 130 and the display panel 110.

Further, the data line DL may be provided as a plurality of data lines DL and may be disposed to extend in a first direction. Further, the gate line GL may be provided as a plurality of gate lines GL and disposed to extend in a second direction.

The data driver 120 may drive the plurality of data lines DL. Here, the data driver 120 is referred to as a "source driver."

Further, the gate driver 130 may drive the plurality of gate lines GL. Here, the gate driver 130 is referred to as a "scan driver."

The controller 140 may control the data driver 120 and the gate driver 130. In an aspect, the controller 140 may provide various control signals to the data driver 120 and the gate driver 130.

In an aspect, the controller 140 may begin scanning according to a timing implemented in each frame and convert input image data, which is input from the outside, according to a data signal format used in the data driver 120. In addition, the controller 140 may output the converted image data and control data driving at a suitable time according to the scanning.

Further, together with the input image data, the controller 140 may receive various timing signals including an vertical synchronization signal Vsync, a horizontal synchronization signal Hsync, an input data enable (DE) signal, and a clock signal CLK from the outside (for example, a host system).

Further, the controller 140 may be a timing controller used in a display technique or a control device which includes the timing controller and further performs other control functions.

Further, the gate driver 130 may sequentially supply an ON or OFF scan signal (e.g., a voltage) to the plurality of gate lines GL under the control of the controller 140.

When a specific gate line GL is turned on due to the gate driver 130, the data driver 120 may convert the image data received from the controller 140 into an analog data signal (e.g., a voltage) and supply the analog data signal to the plurality of data lines DL.

In addition, although the data driver 120 has been illustrated as being located at only one side (e.g., an upper side or a lower side) of the display panel 110 in the drawing, the data driver 120 may be located at both sides (e.g., the upper side or the lower side) of the display panel 110 according to a driving method, a panel design method, or the like.

In addition, although the gate driver 130 has been illustrated as being located at only one side (e.g., a left side or a right side) of the display panel 110 in the drawing, the gate driver 130 may be located at both sides (e.g., the left side or the right side) of the display panel 110 according to a driving method, a panel design method, or the like.

Further, the display device 100 according to the present disclosure may be various types of devices such as a liquid crystal display (LCD) device, an organic light emitting display (OLED) device, a plasma display device, and the like. For example, the display device 100 may be an LCD device driven by an in-plane switching (IPS) method which expresses a screen by a method of horizontally arranging liquid crystal molecules and rotating the liquid crystal molecules in place and has advantages such as high resolution, low power, and a wide viewing angle. Alternatively, the display device 100 may be an advanced high (AH) performance-IPS type LCD device.

Further, each sub-pixel SP disposed in the display panel 110 may include circuit elements such as transistors and the like. The sub-pixel SP may be a unit for emitting a different color or a group of units for emitting different colors. For example, the sub-pixel SP may emit red, green, and blue colors, or red, green, blue, and white colors. A description thereof will be made below.

Further, the display device 100 according to the present aspect may include a plurality of touch electrodes TE serving as a touch sensor and a touch circuit 150 for sensing a touch by driving the plurality of touch electrodes TE.

A size of each of the touch electrodes TE may be equal or correspond to that of a single sub-pixel SP. Alternatively, the size of each of the touch electrodes TE may correspond to or be larger than those of the plurality of sub-pixels SP. That is, it should be understood that the size of each of the touch electrodes TE may correspond to that of at least one sub-pixel SP.

Further, the touch circuit 150 may sequentially drive the plurality of touch electrodes TE by sequentially supplying touch driving signals to the plurality of touch electrodes TE. In an aspect, the touch driving signal may have a waveform of a pulse modulated signal with two or more voltage levels.

Further, when the touch driving signal is applied, the touch circuit 150 may receive a touch sensing signal from the touch electrode TE. The touch sensing signal received from each of the plurality of touch electrodes TE may be varied according to whether a touch is generated due to a pointer, such as a finger or a pen, in the vicinity of a corresponding touch electrode. The touch circuit 150 may calculate a variance in capacitance (or a variance in voltage or a variance in charge) in the touch electrode TE through the touch sensing signal and obtain the presence or absence of a touch and touch coordinates from the calculated variance in capacitance.

Further, each touch electrode TE may be connected to a sensing line SL to receive the touch driving signal and may receive the touch driving signal through the sensing line SL.

Further, the display device 100 according to the present aspect may further include a switching circuit 160 for sequentially connecting the sensing line SL to the touch circuit 150 so as to sequentially supply the touch driving signals to the plurality of touch electrodes TE.

The switching circuit 160 may be formed of at least one multiplexer. However, the present disclosure is not limited thereto.

Meanwhile, each of the plurality of touch electrodes TE may be disposed and embedded in the display panel 110. Further, each of the touch electrodes TE may be formed in a block shape.

That is, the display panel 110 may include a touch screen or a touch screen panel. In an aspect, the display panel 110 may be an in-cell or on-cell type touch screen embedded display panel.

Further, the display device 100 according to the present disclosure may operate in a display mode to provide a display function or operate in a touch mode to provide a touch sensing function.

Alternatively, the plurality of touch electrodes TE operate as a touch sensor in a touch mode section and may be used as a common electrode in a display mode section.

For example, in the display mode section, the plurality of touch electrodes TE may operate as a common electrode to which a common voltage Vcom is applied. Here, the common voltage Vcom is a voltage corresponding to a pixel voltage applied to a pixel electrode.

Meanwhile, as shown in FIG. 1, the plurality of touch electrodes TE, which are embedded and disposed in the display panel 110, may be disposed in the form of a matrix having N (N>2) rows and M (M>2) columns.

Figure 2:
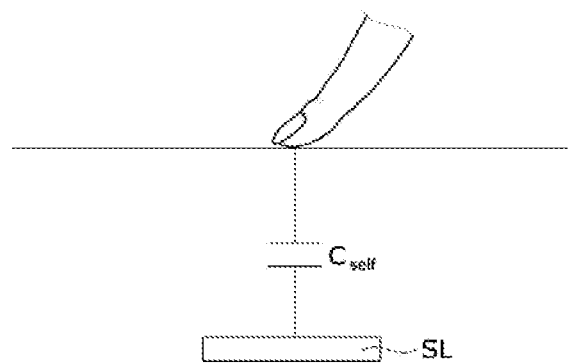
FIG. 2 is a diagram illustrating a capacitance component generated from the display device in a touch mode according to the present disclosure.
Figure 3:
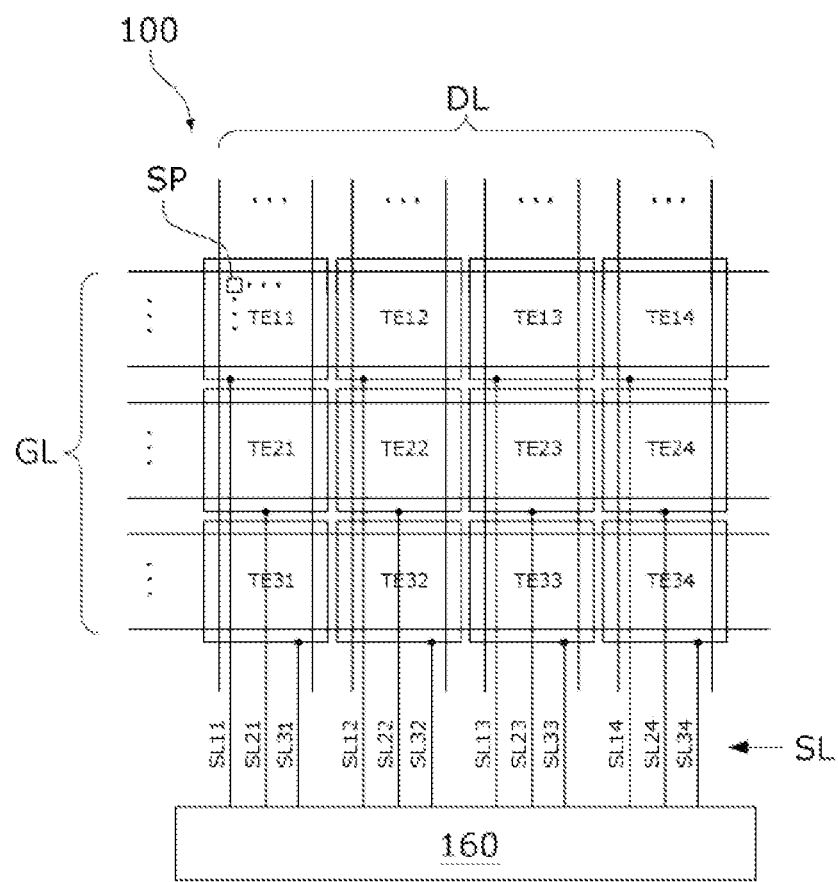
FIG. 3 is a plan view illustrating a display panel included in the display device according to the present disclosure.
Figure 4:
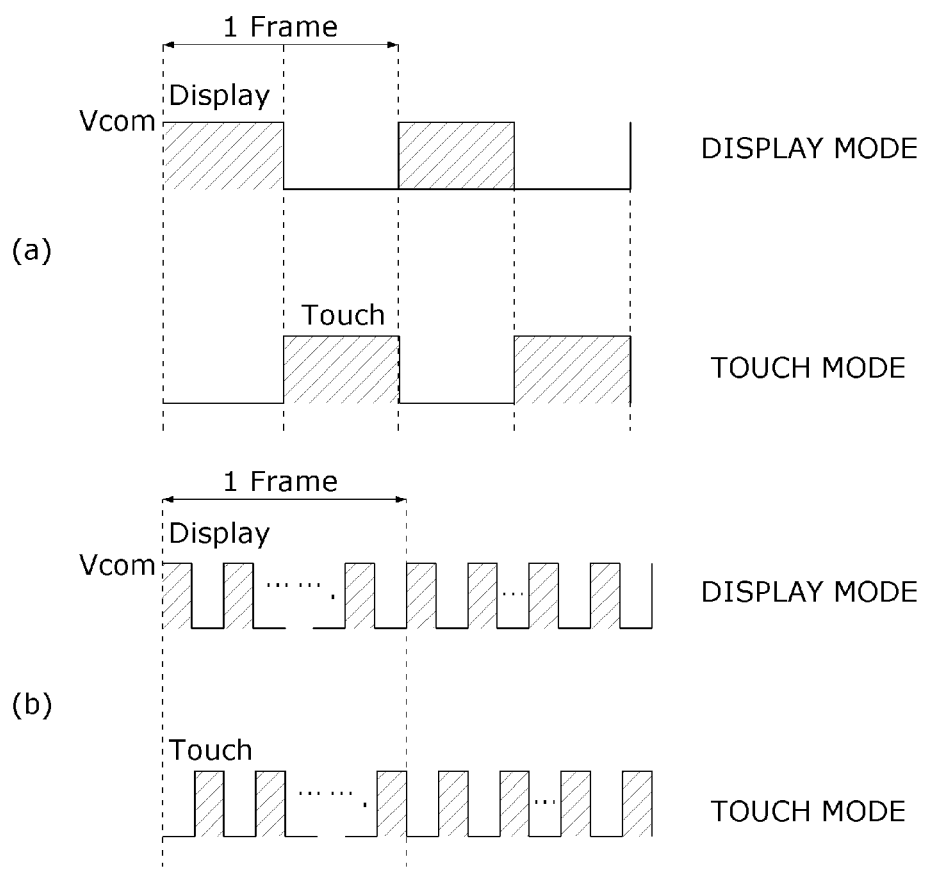
FIG. 4 is a diagram for describing signals applied to sensing lines.
Figure 5:
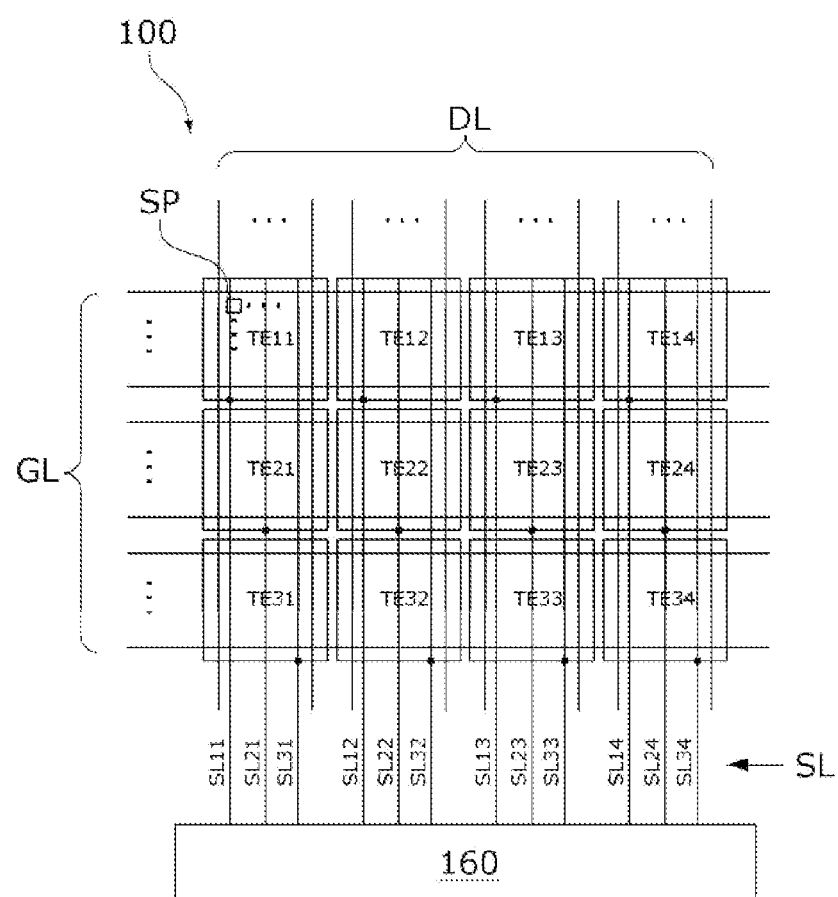
FIG. 5 is a diagram illustrating another aspect of FIG. 3.

FIG. 2 is a diagram illustrating a capacitance component generated from the display device in a touch mode according to the present disclosure, FIG. 3 is a plan view illustrating a display panel included in the display device according to the present disclosure, FIG. 4 is a diagram for describing signals applied to sensing lines, and FIG. 5 is a diagram illustrating another aspect of FIG. 3.

Referring to FIGS. 2 to 4, the plurality of touch electrodes TE may serve as the touch electrode in the touch mode and serve as the common electrode to which the common voltage Vcom is applied so as to form the pixel electrode and a liquid crystal capacitor in the display mode. For example, in the touch mode, the touch electrode TE and a pointer, such as a finger or a pen, may form a self-capacitance Cself so as to detect the presence or absence of a touch and touch coordinates.

Further, in the display panel 110 according to the present aspect of the present disclosure, a plurality of touch electrodes TE11 to TE14, TE21 to TE24, and TE31 to TE34 may be electrically connected to the sensing line SL and may serve as the common electrode and the touch electrodes TE due to voltages applied through the sensing line SL. In this disclosure, a description will be made based on the foregoing. Thus, it should be understood that the touch electrode TE in each sub-pixel may also serve as the common electrode.

A sensing line SL can be provided to the display device. Furthermore, a plurality of sensing lines SL may be provided in the display device and electrically connected to each touch electrode TE through the switching circuit 160. For example, the plurality of touch electrodes TE11 to TE14, TE21 to TE24, and TE31 to TE34 may be electrically connected to a plurality of sensing lines SL11 to SL14, SL21 to SL24, and SL31 to SL34 to apply the common voltage Vcom or the touch driving signals.

In an aspect, the display device 100 may perform the display mode and the touch mode within one frame. Consequently, the common voltage Vcom may be applied to the sensing lines SL in display mode, and the touch driving signals may be applied to the sensing lines SL in the touch mode.

Further, the display mode and the touch mode may be alternately performed multiple times in one frame. For example, the display mode and the touch mode may be performed once in one frame. Alternatively, the display mode and the touch mode may be alternately performed multiple times in one frame.

Referring to FIG. 5, the sensing lines SL may be disposed in parallel or orthogonal to the gate lines GL and disposed to overlap touch electrodes disposed in the same column among the plurality of touch electrodes TE11 to TE14, TE21 to TE24, and TE31 to TE34. For example, even though a sensing line SL31 is electrically connected to a specific touch electrode TE31, the sensing line SL31 may be disposed to overlap the touch electrodes TE11, TE21, and TE31 disposed in the same column. Consequently, parasitic capacitance generated due to sensing lines SL may be uniformly formed within each touch electrode TE or each sub-pixel SP.

Figure 6:
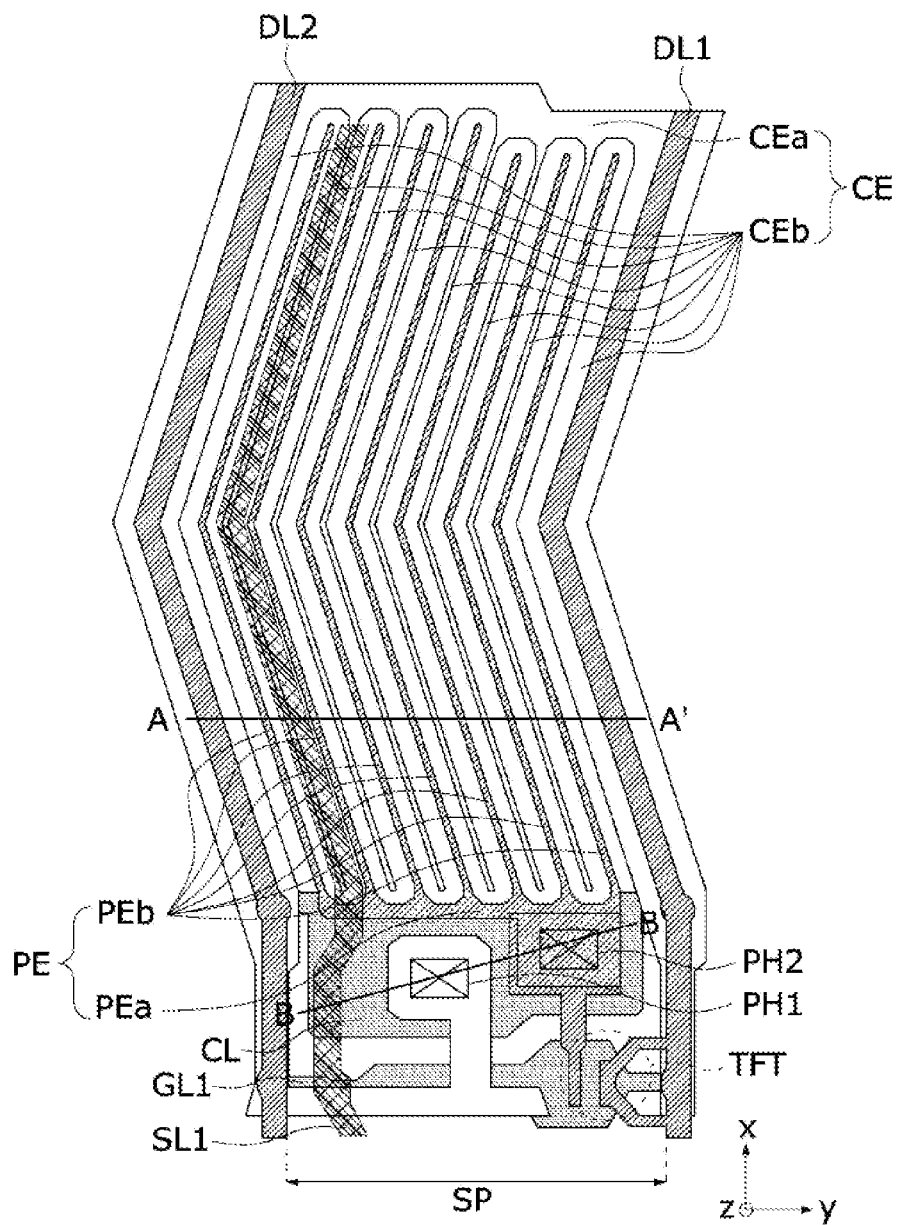
FIG. 6 is a plan view illustrating a sub-pixel of a display device according to a first aspect of the present disclosure.
Figure 7:
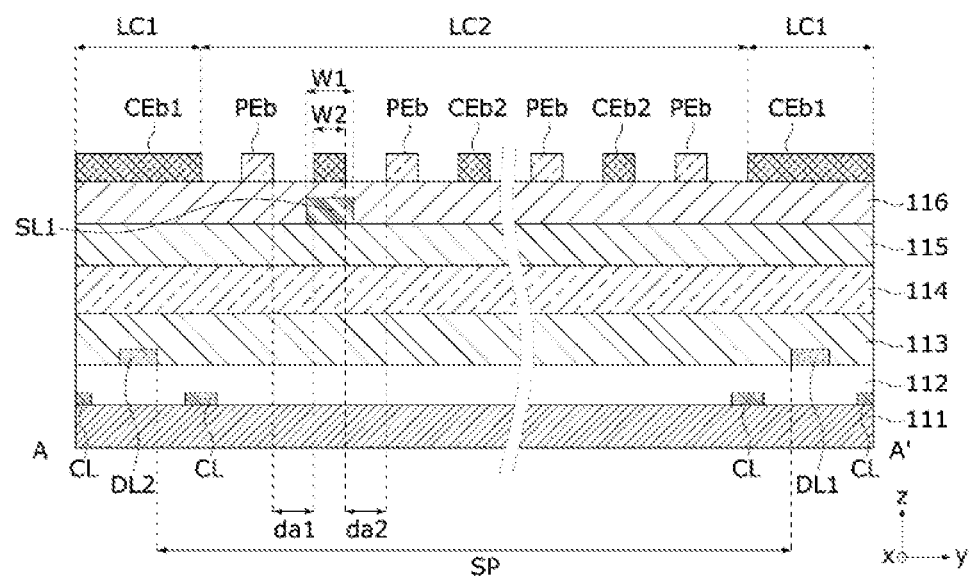
FIG. 7 is a cross-sectional view taken along line A-A' in FIG. 6.
Figure 8:
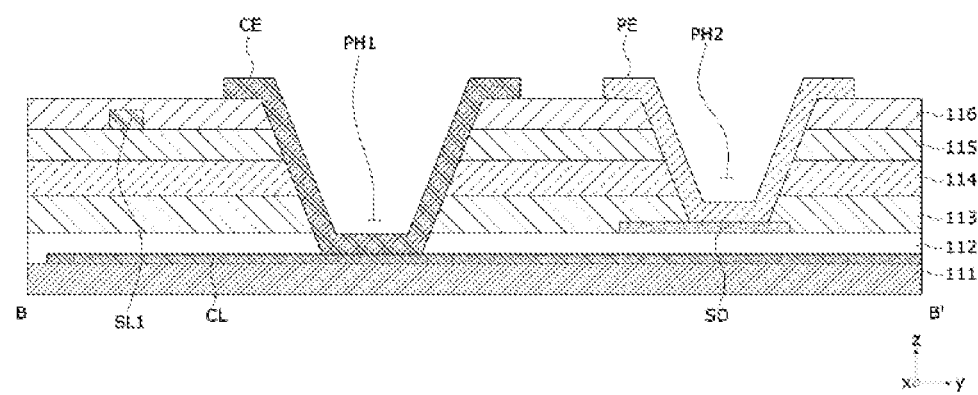
FIG. 8 is a cross-sectional view taken along line B-B' in FIG. 6.

FIG. 6 is a plan view illustrating a sub-pixel of a display device according to a first aspect of the present disclosure, FIG. 7 is a cross-sectional view taken along line A-A' in FIG. 6, and FIG. 8 is a cross-sectional view taken along line B-B' in FIG. 6.

Referring to FIG. 6, as described above, in the display device according to the first aspect of the present disclosure, a sub-pixel is defined by the plurality of data lines extending in the first direction and the plurality of gate lines extending in the second direction. In addition, in the drawings, the first direction is the extension direction of the data line and corresponds to an X-axis direction, the second direction corresponds to a Y-axis direction, a third direction corresponds to a Z-axis direction, and a description of the present disclosure will be made based on the above directions. Further, the first direction is perpendicular to the second direction, and the third direction is perpendicular to the first direction and the second direction. Further, the third direction may be the same as a stacked direction of each layer in the display panel. However, it should be understood that the above-described directions may be changed according to a shape of the data line.

A common line CL may be disposed to extend in the second direction (Y-axis direction). Further, the common line CL may be disposed in the above-described touch electrode TE. Thus, the common voltage Vcom may be applied to each touch electrode TE through the common line CL.

In an aspect, the common line CL may be electrically connected to a sensing line SL1. Further, the common line CL may also be electrically connected to a common electrode CE disposed in each sub-pixel SP. Thus, in the display mode, the common voltage Vcom may be applied from the sensing line SL1 to the common line CL in each touch electrode TE, and the common voltage Vcom may be applied to the common electrode CE in each sub-pixel SP along the common line CL.

Further, in the touch mode, the touch driving signal may be applied from the sensing line SL1 to the common line CL in each touch electrode TE. Further, the touch driving signal may be transmitted to the common electrode CE along the common line CL. Accordingly, the touch driving signal may be applied to each of the plurality of touch electrodes TE, and the touch circuit 150 may determine the presence and absence of a touch and touch coordinates using the touch driving signal (i.e., the touch sensing signal) which is modified due to a variation in self-capacitance Cself resulting from a touch.

As described above, a gate line GL1 may be disposed to extend in the second direction (Y-axis direction). Further, data lines DL1 and DL2 may extend in the first direction (X-axis direction) different from a direction of the gate line GL1.

Further, as described above, in the display device according to the present aspect, each loop formed or defined by the plurality of gate lines and the plurality of data lines may be a sub-pixel. From FIG. 6, a description will be made based on a single sub-pixel SP.

In the sub-pixel SP, a data line and a gate line, which are adjacent to each other, may be electrically connected by a thin film transistor (TFT). In an aspect, a source electrode of the TFT may be electrically connected to an adjacent data line. In addition, a drain electrode of the TFT may be electrically connected to the pixel electrode PE in the sub-pixel SP. Further, a gate electrode of the TFT may be electrically connected to the gate line GL1. However, the present disclosure is not limited thereto, and the pixel electrode PE may be connected to the source electrode of the TFT.

Further, the sub-pixel SP may be formed of an opening area in which an image is displayed by the pixel electrode PE and the common electrode CE and a non-opening area in which an element (e.g., the TFT or the like) for driving the pixel electrode PE and the common electrode CE is disposed.

The pixel electrode PE and the common electrode CE may form an electric field. Further, a liquid crystal may be tilted due to the formed electric field. The electric field between the pixel electrode PE and the common electrode CE may be formed in the display mode.

Further, the pixel electrode PE may include a plurality of pixel electrodes (hereinafter referred to as "pixel branch electrodes" PEb) extending in the first direction (X-axis direction) in parallel, and a pixel electrode (hereinafter referred to as a "pixel stem electrode" PEa) for connecting the pixel branch electrodes PEb which extend in the first direction.

The pixel stem electrode PEa may be electrically connected to the drain electrode of the above-described TFT. In an aspect, the pixel stem electrode PEa may be electrically connected to the drain electrode of the TFT through a second through-hole PH2.

Further, the pixel stem electrode PEa may be disposed to extend in the second direction (Y-axis direction) and electrically connected to the plurality of pixel branch electrodes PEb.

The pixel branch electrode PEb may extend in the first direction (X-axis direction) and may be provided as the plurality of pixel branch electrodes PEb. The pixel branch electrodes PEb may be disposed in parallel with the adjacent data lines DL1 and DL2. Further, the pixel branch electrodes PEb may be disposed in parallel with common branch electrodes CEb which will be described below.

Further, the plurality of pixel branch electrodes PEb may be disposed to be spaced the same interval from an adjacent pixel branch electrode. Further, the pixel branch electrodes PEb may be alternately disposed with the common branch electrodes CEb in the second direction (Y-axis direction).

Further, the pixel electrode PE may be made of a conductive material. In an aspect, the pixel electrode PE may be made of a transparent conductive film. For example, the transparent conductive film may include a transparent and conductive material such as indium tin oxide (ITO) or indium zinc oxide (IZO).

The common electrode CE may include a plurality of common electrodes (hereinafter referred to as "common branch electrodes" CEb) extending in the first direction (X-axis direction) in parallel with each other, and a common electrode (hereinafter referred to as a "common stem electrode" CEa) for connecting the plurality of common branch electrodes CEb extending in the first direction (X-axis direction).

The common stem electrode CEa may be electrically connected to the common line CL. Further, since the common line CL is electrically connected to the sensing line SL1, the common stem electrode CEa may be electrically connected to the sensing line SL1. In FIG. 6, the sensing line SL1 electrically connected to the common stem electrode CEa through a through-hole or the like is not illustrated. However, as described above, it should be understood that the common line CL is electrically connected to the sensing line in another sub-pixel in each touch electrode TE, and the common line CL extends to overlap the plurality of sub-pixels, which are disposed in the second direction (Y-axis direction), in the third direction so that the sensing line SL1 may be electrically connected to the common stem electrode CEa of the sub-pixel SP.

Further, the common stem electrode CEa may be disposed to extend in the second direction (Y-axis direction) and electrically connected to the plurality of common branch electrodes CEb.

The common branch electrode CEb may extend in the first direction (X-axis direction) and may be provided as the plurality of common branch electrodes CEb. The common branch electrodes CEb may be disposed in parallel with adjacent pixel branch electrodes PEb or adjacent data lines DL1 and DL2. Further, as described above, the common branch electrodes CEb may be alternately disposed in parallel with the pixel branch electrodes PEb.

In an aspect, the common branch electrodes CEb may be disposed to be spaced the same interval from adjacent common branch electrodes CEb. Further, the common branch electrodes CEb and the pixel branch electrodes PEb may be alternately disposed in the second direction (Y-axis direction). However, the present disclosure is not limited thereto.

Further, the common electrode CE may be made of a conductive material. In an aspect, the common electrode CE may be made of a transparent conductive film. For example, the transparent conductive film may include a transparent and conductive material such as ITO or IZO.

Further, the common electrode CE may be located coplanar with the pixel electrode PE. In an aspect, the common electrode CE may at least partially overlap the pixel electrode PE in the second direction (Y-axis direction). Further, the common branch electrodes CEb may overlap the pixel branch electrodes PEb in the second direction (Y-axis direction).

Referring to FIG. 7, a display substrate according to the present aspect may be formed of a plurality of layers.

The display panel may include a substrate 111, the common line CL and a gate line disposed on the substrate 111, a gate insulating layer 112 on the common line CL and the gate line, data lines DL1 and DL2 on the gate insulating layer 112, a first insulating layer 113 on the data lines DL1 and DL2, a filter layer 114 on the first insulating layer 113, a second insulating layer 115 on the filter layer 114, and a planarization layer 116 on the second insulating layer 115.

A TFT may be formed on the substrate 111. The substrate 111 may be made of various materials such as glass and the like.

The gate insulating layer 112 may electrically insulate the common line CL from an active layer (not shown). The data lines DL1 and DL2 may be disposed on the active layer (not shown). In addition, the gate insulating layer 112 may electrically insulate the common line CL from the data lines DL1 and DL2.

Further, a source electrode and a drain electrode spaced apart therefrom may be disposed on the active layer (not shown). Further, the active layer (not shown) may form a channel in a separation space between the source electrode and the drain electrode in an upper region corresponding to the gate line. The active layer (not shown) may be formed of any one of polycrystalline polysilicon, low temperature polysilicon (LTPS), and an oxide semiconductor.

Further, the gate insulating layer 112 may be formed of an insulating material such as a silicon oxide ($SiO_x$) film, a silicon nitride ($SiN_x$) film, or the like. Further, the gate insulating layer 112 may be formed of a transparent material. Further, the gate insulating layer 112 may be formed of a single layer or a multilayer.

Each of the common line CL, the data lines DL1 and DL2, and the gate line may be formed of any one selected from the group consisting of molybdenum (Mo), aluminum (Al), chromium (Cr), gold (Au), titanium (Ti), nickel (Ni), neodymium (Nd), and copper (Cu), or an alloy thereof.

Further, each of the source electrode and the drain electrode may also be made of any one selected from the group consisting of Mo, Al, Cr, Au, Ti, Ni, Nd, and Cu, or an alloy thereof.

The first insulating layer 113 may be located on the gate insulating layer 112. Further, the first insulating layer 113 may be located on the data lines DL1 and DL2.

Further, the first insulating layer 113 may be formed of an insulating material such as a $SiO_x$ film, a $SiN_x$ film, or the like. Further, the first insulating layer 113 may be formed of a transparent material and made as a single layer or a multilayer.

Meanwhile, the source electrode and the drain electrode may be disposed on the first insulating layer 113.

The filter layer 114 may be disposed on the first insulating layer 113. The filter layer 114 may include a red color filter, a blue color filter, and a green color filter. Further, the filter layer 114 may have a structure in which the red color filter and the blue color filter are stacked so as to block light.

The second insulating layer 115 may be disposed on the filter layer 114. The second insulating layer 115 may be formed of an insulating material such as a $SiO_x$ film, a $SiN_x$ film, or the like. In addition, the first insulating layer 113 may be formed of a transparent material and made as a single layer or a multilayer.

Further, the sensing line SL1 may be disposed on the second insulating layer 115.

Further, the planarization layer 116 may be disposed on the second insulating layer 115. A top surface of the planarization layer 116 may be formed to be flat so as to remove a step formed in each layer below the planarization layer 116.

The planarization layer 116 may be formed of an organic material such as photo acryl, polyimide, benzocyclobutene resin, acrylate resin, or the like.

Referring to FIG. 8, the common electrode CE and the pixel electrode PE may be disposed on the planarization layer 116.

Further, the common electrode CE may be electrically connected to the common line CL through a first through-hole PH1.

In an aspect, the first through-hole PH1 may be formed to pass through the planarization layer 116, the second insulating layer 115, the filter layer 114, the first insulating layer 113, and the gate insulating layer 112. That is, the common line CL may be exposed due to the first through-hole PH1.

The common electrode CE may be disposed in the first through-hole PH1 and be in contact with the exposed common line CL to be electrically connected thereto. Thus, the common electrode CE may at least partially overlap the first through-hole PH1 in the third direction (Z-axis direction). With the above configuration, a common voltage applied through the sensing line SL1 may be applied to the common electrode CE through the common line CL.

The pixel electrode PE may be electrically connected to a source electrode/drain electrode SD of a transistor through the second through-hole PH2.

In an aspect, the second through-hole PH2 may pass through the planarization layer 116, the second insulating layer 115, the filter layer 114, and the first insulating layer 113. Accordingly, the source electrode/drain electrode SD may be exposed due to the second through-hole PH2.

The pixel electrode PE may be disposed in the second through-hole PH2 and be electrically connected to the exposed source electrode/drain electrode SD. It should be understood that the exposed source electrode/drain electrode SD may be a line extending from the source electrode or the drain electrode of the TFT. In addition, the pixel electrode PE may overlap the second through-hole PH2 in the third direction (Z-axis direction).

Further, since the TFT supplied a voltage to the pixel electrode PE according to a data signal supplied from the data line, an electric field may be formed between the pixel electrode PE and the common electrode CE and an image may be output.

Referring to FIGS. 6 and 7 again, the common branch electrodes CEb may include first common electrodes CEb1 disposed at outermost sides and second common electrodes CEb2 disposed between the first common electrodes CEb1 at the outermost sides.

Thus, the first common electrodes CEb1 may be provided as two first common electrodes CEb1 in a single sub-pixel SP. Further, the first common electrode CEb1 may be disposed between the two first common electrodes CEb1, and the two first common electrodes CEb1 may be spaced apart from the second common electrodes CEb2 in the second direction (Y-axis direction).

Further, as shown in the drawing, in the sub-pixel SP, the first common electrodes CEb1 may be disposed further toward an outer side than the pixel branch electrodes PEb. Alternatively, in the sub-pixel SP, the first common electrodes CEb1 may be disposed further toward an inner side than the pixel branch electrodes PEb. Hereinafter, a description will be made based on the drawings. The inner side may be a direction toward a center of the sub-pixel from an edge thereof, and the outer side may be a direction opposite to the direction of the inner side.

Further, the sensing line SL1 may be located below the first common electrodes CEb1 and the second common electrodes CEb2. In an aspect, the sensing line SL1 may be spaced apart from the pixel electrode PE and the common electrode CE in the third direction (Z-axis direction).

Further, the sensing line SL1 may be disposed between the two first common electrodes CEb1. In other words, the sensing line SL1 may be disposed between adjacent first common electrodes CEb1 in the sub-pixel SP. With the above configuration, even when the common voltage Vcom is applied to the sensing line SL1 and the first common electrodes CEb1, an electric field may be formed between the pixel electrodes PE.

Further, the sensing line SL1 may be spaced apart from the first common electrodes CEb1 in the second direction (Y-axis direction). For example, the sensing line SL1 may be located in an electric field area LC2. Thus, when the common voltage Vcom is applied to the sensing line SL1, the electric field area LC2 is present between the two first common electrodes CEb1 so that an aperture ratio is improved and an electric field may be easily formed between the pixel electrode PE in the electric field area LC2.

In an aspect, the display panel may include a non-electric field area LC1 and the electric field area LC2. The non-electric field area LC1 is an area in which an electric field for tilting the liquid crystal is not formed between the common electrode CE and the pixel electrode PE. Further, the electric field area LC2 is an area in which an electric field for tilting the liquid crystal is formed between the common electrode CE and the pixel electrode PE.

For example, the non-electric field area LC1 may be an area between the common branch electrodes when the pixel electrode is not present therebetween. Alternatively, as shown in the drawings, the non-electric field area LC1 may be at least a part of an area on the common electrode when a width of the common electrode is large. Further, the electric field area LC2 may be an area in which the pixel electrodes and the common electrodes are alternately disposed in parallel.

The sensing line SL1 may be disposed between the common branch electrodes CEb, between the pixel branch electrodes PEb, or between the common branch electrode and the pixel branch electrode which are adjacent to each other.

In an aspect, the sensing line SL1 may be disposed to overlap the second common electrode CEb2. In other words, the second common electrode CEb2 may overlap the sensing line SL1 in the third direction (Z-axis direction). With the above configuration, it is possible to reduce blocking of light due to the sensing line SL1. That is, transmittance of the display device according to the present aspect may be improved.

Further, in an aspect, a width W1 of the sensing line SL1 may be larger than a width W2 of the second common electrode CEb2. Thus, at least a part of the sensing line SL1 may overlap the second common electrode CEb2 in the third direction (Z-axis direction).

Further, the sensing line SL1 may be located between adjacent pixel branch electrodes PEb to improve electric field formation with respect to the adjacent pixel branch electrodes PEb.

Alternatively, the sensing line SL1 may be located at a center between the adjacent pixel branch electrodes PEb. In other words, the sensing line SL1 may have separation distances da1 and da2 which are equal to each other between the adjacent pixel branch electrodes PEb in the second direction (Y-axis direction). Thus, the electric field may also be uniformly formed in association with the adjacent pixel branch electrodes PEb based on the sensing line SL1. Further, uniform transmittance of light may be achieved based on the sensing line SL1.

Alternatively, as a modified example, the common line CL may have a step to minimize an area which overlaps the sensing line SL1 in the third direction (Z-axis direction). That is, in the sub-pixel SP, a length of the common line CL in the first direction (X-axis direction) in the area which overlaps the sensing line SL1 in the third direction (Z-axis direction) may be smaller than a length of the common line CL in the first direction (X-axis direction) in an area which does not overlap the sensing line SL1 in the first direction (X-axis direction). With the above configuration, it is possible to minimize capacitance formed between the common line CL and the sensing line SL1.

Further, the sensing line SL1 may be provided as a plurality of sensing lines SL1 in the sub-pixel SP. For example, the plurality of sensing lines SL1 may be disposed to be spaced apart from each other between two first common electrodes CEb1 in the second direction (Y-axis direction).

Alternatively, each of the plurality of sensing lines SL1 may be located between adjacent pixel branch electrodes PEb and may overlap a second common electrode CEb2 located between the adjacent pixel branch electrodes PEb.

Further, the plurality of sensing lines SL1 may be symmetrically disposed in the sub-pixel SP in the first direction (X-axis direction). Consequently, parasitic capacitance formed due to the sensing lines SL1 may also be uniformly formed in the sub-pixel SP.

Figure 9:
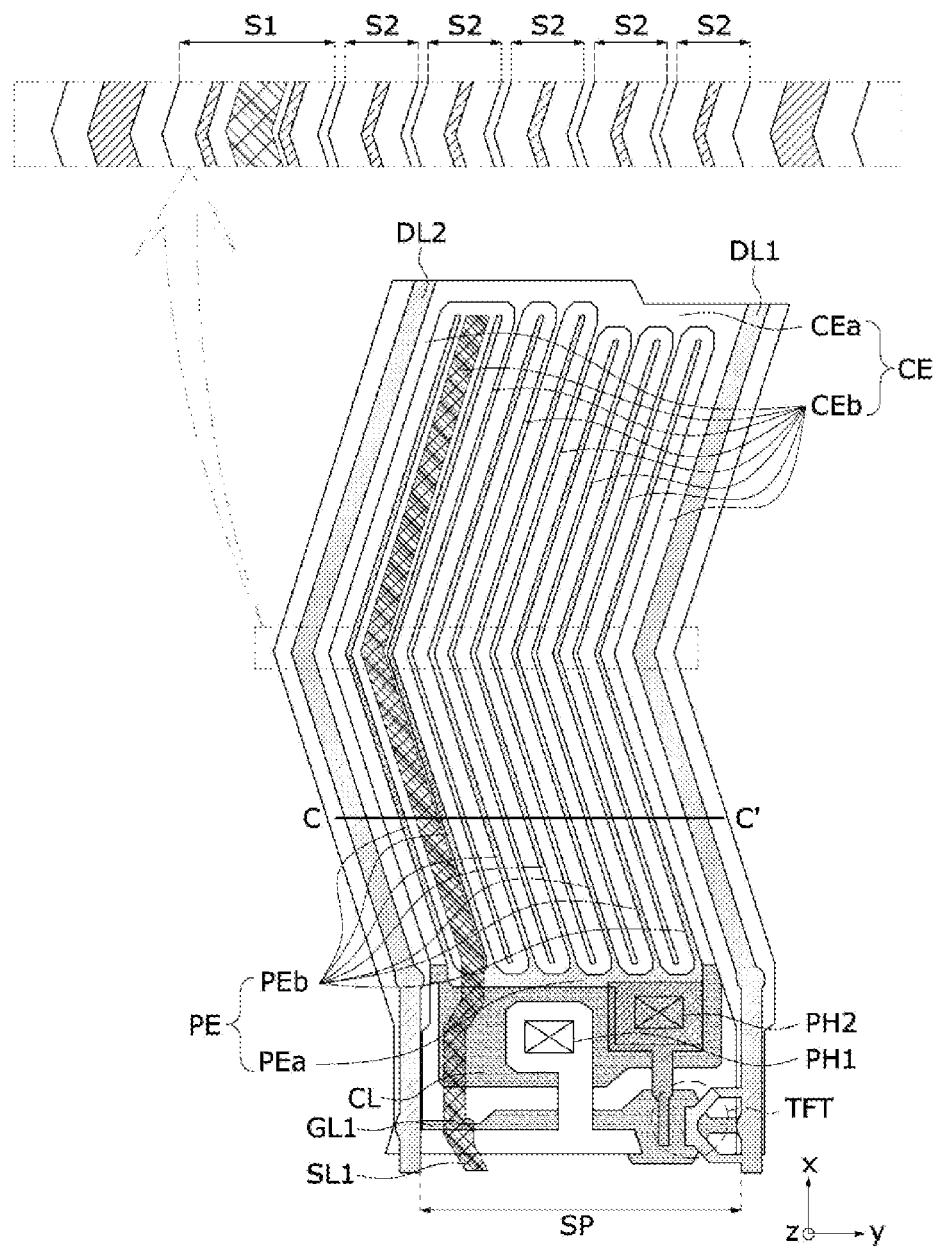
FIG. 9 is a plan view illustrating a sub-pixel of a display device according to a second aspect of the present disclosure.
Figure 10:
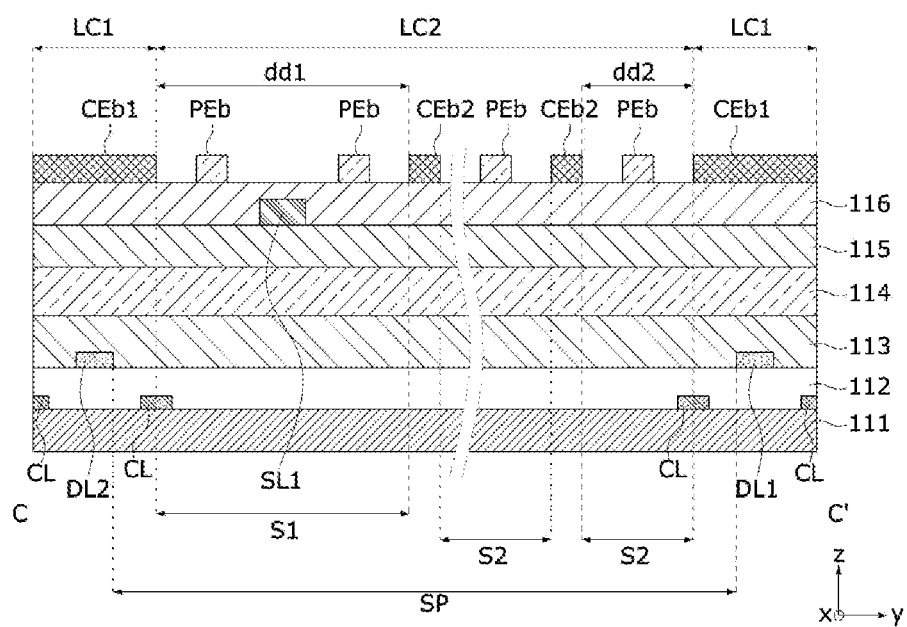
FIG. 10 is a cross-sectional view taken along line C-C' in FIG. 9.

FIG. 9 is a plan view illustrating a sub-pixel of a display device according to a second aspect of the present disclosure, and FIG. 10 is a cross-sectional view taken along line C-C' in FIG. 9.

Referring to FIGS. 9 and 10, as described above, even in a display device according to the second aspect of the present disclosure, a sub-pixel may be defined by a plurality of data lines extending in the first direction and a plurality of gate lines extending in the second direction. In a description of a direction, the above description may be equally applied to the present aspect.

A common line CL may be disposed to extend in the second direction (Y-axis direction). Further, the common line CL may be disposed in the above-described touch electrode TE. Thus, a common voltage Vcom may be applied to each touch electrode TE through the common line CL.

In an aspect, the common line CL may be electrically connected to a sensing line SL1. Further, the common line CL may also be electrically connected to a common electrode CE disposed in each sub-pixel SP. Thus, in the display mode, the common voltage Vcom may be applied from the sensing line SL1 to the common line CL in each touch electrode TE, and the common voltage Vcom may be applied to the common electrode CE in each sub-pixel SP along the common line CL.

Further, in a touch mode, a touch driving signal may be applied from the sensing line SL1 to the common line CL in each touch electrode TE. Further, the touch driving signal may be transmitted to the common electrode CE along the common line CL. Accordingly, the touch driving signal may be applied to each of the plurality of touch electrodes TE, and a touch circuit may determine the presence and absence of a touch and touch coordinates using the touch driving signal (i.e., the touch sensing signal) which is modified due to a variation in self-capacitance resulting from a touch.

In addition, as described above, a gate line GL1 may be disposed to extend in the second direction (Y-axis direction). Further, data lines may extend in the first direction (X-axis direction) different from a direction of the gate line GL1.

In the sub-pixel SP, a data line and a gate line, which are adjacent to each other, may be electrically connected by a TFT. In an aspect, a source electrode of the TFT may be electrically connected to an adjacent data line. In addition, a drain electrode of the TFT may be electrically connected to the pixel electrode PE in the sub-pixel SP. Further, a gate electrode of the TFT may be electrically connected to the gate line GL1. However, the present disclosure is not limited thereto, and the pixel electrode PE may be connected to the source electrode of the TFT.

Further, the sub-pixel SP may be formed of an opening area in which an image is displayed by the pixel electrode PE and the common electrode CE and a non-opening area in which an element (e.g., the TFT or the like) for driving the pixel electrode PE and the common electrode CE is disposed.

In the display mode, the pixel electrode PE may form an electric field together with the common electrode CE. Further, a liquid crystal may be tilted due to the formed electric field.

Further, the pixel electrode PE may include a plurality of pixel electrodes (hereinafter referred to as "pixel branch electrodes" PEb) extending in the first direction (X-axis direction) in parallel, and a pixel electrode (hereinafter referred to as a "pixel stem electrode" PEa) for connecting the pixel branch electrodes which extend in the first direction.

The pixel stem electrode PEa may be electrically connected to the drain electrode of the above-described TFT. In an aspect, the pixel stem electrode PEa may be electrically connected to the drain electrode of the TFT through a second through-hole PH2. A description thereof will be made below.

Further, the pixel stem electrode PEa may be disposed to extend in the second direction (Y-axis direction) and electrically connected to the plurality of pixel branch electrodes PEb.

The pixel branch electrode PEb may extend in the first direction (X-axis direction) and may be provided as the plurality of pixel branch electrodes PEb. The pixel branch electrodes PEb may be disposed in parallel with the adjacent data lines DL1 and DL2. In addition, the pixel branch electrodes PEb may be disposed in parallel with common branch electrodes CEb which will be described below.

Further, the plurality of pixel branch electrodes PEb may be disposed to be spaced the same interval from an adjacent pixel branch electrode. Further, the pixel branch electrodes PEb and the common branch electrodes CEb may be alternately disposed in the second direction (Y-axis direction).

Further, the pixel electrode PE may be made of a conductive material. In an aspect, the pixel electrode PE may be made of a transparent conductive film. For example, the transparent conductive film may include a transparent and conductive material such as ITO or IZO.

The common electrode CE may include a plurality of common electrodes (hereinafter referred to as "common branch electrodes" CEb) extending in the first direction (X-axis direction) in parallel with each other, and a common electrode (hereinafter referred to as a "common stem electrode" CEa) for connecting the plurality of common branch electrodes CEb extending in the first direction (X-axis direction).

The common stem electrode CEa may be electrically connected to the common line CL. Further, since the common line CL is electrically connected to the sensing line SL1, the common stem electrode CEa may be electrically connected to the sensing line SL1. In FIG. 9, the sensing line SL1 being electrically connected to the common stem electrode CEa through a through-hole or the like is not illustrated. However, in the present disclosure, the common line CL may be electrically connected to the sensing line in another sub-pixel in each touch electrode TE, and the common line CL may extend to overlap the plurality of sub-pixels, which are disposed in the second direction (Y-axis direction), in the third direction so that the sensing line SL1 may be electrically connected to the common stem electrode CEa of the sub-pixel SP.

Further, the common stem electrode CEa may be disposed to extend in the second direction (Y-axis direction) and electrically connected to the plurality of common branch electrodes CEb.

The common branch electrode CEb may extend in the first direction (X-axis direction) and may be provided as the plurality of common branch electrodes CEb. The common branch electrodes CEb may be disposed in parallel with adjacent pixel branch electrodes PEb or adjacent data lines DL1 and DL2. Further, as described above, the common branch electrodes CEb may be alternately disposed in parallel with the pixel branch electrodes PEb.

In an aspect, the common branch electrodes CEb may be disposed to be spaced the same interval from an adjacent common branch electrodes CEb. However, the present disclosure is not limited thereto.

In addition, the common branch electrodes CEb may be alternately disposed with the pixel branch electrodes PEb in the second direction (Y-axis direction).

Further, the common electrode CE may be made of a conductive material. In an aspect, the common electrode CE may be made of a transparent conductive film. For example, the transparent conductive film may include a transparent and conductive material such as ITO or IZO.

Further, the common electrode CE may be located coplanar with the pixel electrode PE. In an aspect, the common electrode CE may at least partially overlap the pixel electrode PE in the second direction (Y-axis direction). Further, the common branch electrodes CEb may overlap the pixel branch electrodes PEb in the second direction (Y-axis direction).

Further, the display panel may be formed of a plurality of layers. The display panel may include a substrate 111, the common line CL and a gate line disposed on the substrate 111, a gate insulating layer 112 on the common line CL and the gate line, data lines DL1 and DL2 on the gate insulating layer 112, a first insulating layer 113 on the data lines DL1 and DL2, a filter layer 114 on the first insulating layer 113, a second insulating layer 115 on the filter layer 114, and a planarization layer 116 on the second insulating layer 115.

A TFT may be formed on the substrate 111. The substrate 111 may be made of various materials such as glass and the like.

The gate insulating layer 112 may electrically insulate the common line CL from an active layer (not shown). The data lines DL1 and DL2 may be disposed on the active layer (not shown). In addition, the gate insulating layer 112 may electrically insulate the common line CL from the data lines DL1 and DL2.

Further, a source electrode and a drain electrode spaced apart therefrom may be disposed on the active layer (not shown). Further, the active layer (not shown) may form a channel in a separation space between the source electrode and the drain electrode in an upper region corresponding to the gate line. The active layer (not shown) may be formed of any one of polycrystalline polysilicon, LTPS, and an oxide semiconductor.

Further, the gate insulating layer 112 may be formed of an insulating material such as a $SiO_x$ film, a $SiN_x$ film, or the like. Further, the gate insulating layer 112 may be formed of a transparent material. Further, the gate insulating layer 112 may be formed of a single layer or a multilayer.

Each of the common line CL, the data lines DL1 and DL2, and the gate line may be formed of any one selected from the group consisting of Mo, Al, Cr, Au, Ti, Ni, Nd, and Cu, or an alloy thereof.

Further, each of the source electrode and the drain electrode may also be made of any one selected from the group consisting of Mo, Al, Cr, Au, Ti, Ni, Nd, and Cu, or an alloy thereof.

The first insulating layer 113 may be located on the gate insulating layer 112. In addition, the first insulating layer 113 may be located on the data lines DL1 and DL2.

Further, the first insulating layer 113 may be formed of an insulating material such as a SiOx film, a SiNx film, or the like. Further, the first insulating layer 113 may be formed of a transparent material and made as a single layer or a multilayer.

Meanwhile, the source electrode and the drain electrode may be disposed on the first insulating layer 113.

The filter layer 114 may be disposed on the first insulating layer 113. The filter layer 114 may include a red color filter, a blue color filter, and a green color filter. Further, the filter layer 114 may have a structure in which the red color filter and the blue color filter are stacked so as to block light.

The second insulating layer 115 may be disposed on the filter layer 114. The second insulating layer 115 may be formed of an insulating material such as a SiOx film, a SiNx film, or the like. In addition, the first insulating layer 113 may be formed of a transparent material and made as a single layer or a multiplayer.

Further, the sensing line SL1 may be disposed on the second insulating layer 115.

The planarization layer 116 may be disposed on the second insulating layer 115. A top surface of the planarization layer 116 may be formed to be flat so as to remove a step formed in each layer below the planarization layer 116.

The planarization layer 116 may be formed of an organic material such as photo acryl, polyimide, benzocyclobutene resin, acrylate resin, or the like.

Further, it should be understood that the above-described contents may be applied to contents, which will be described in detail below, except for the contents of the above-described components.

In an aspect, the common branch electrodes CEb may include first common electrodes CEb1 disposed at outermost sides and second common electrodes CEb2 disposed between the first common electrodes CEb1 at the outermost sides.

The first common electrodes CEb1 may be provided as two first common electrodes CEb1 in a single sub-pixel SP. In addition, the first common electrode CEb1 may be disposed inside the two first common electrodes CEb1, and the two first common electrodes CEb1 may be spaced apart from the second common electrodes CEb2 in the second direction (Y-axis direction).

Further, as shown in the drawing, in the sub-pixel SP, the first common electrodes CEb1 may be disposed further toward an outer side than the pixel branch electrodes PEb. Alternatively, in the sub-pixel SP, the first common electrodes CEb1 may be disposed further toward an inner side than the pixel branch electrodes PEb. Hereinafter, a description will be made based on the drawings.

Further, the sensing line CEb1 may be located below the first common electrodes CEb1 and the second common electrodes CEb2. In an aspect, the sensing line SL1 may be spaced apart from the pixel electrode PE and the common electrode CE in the third direction (Z-axis direction).

Further, the sensing line SL1 may be disposed between the two first common electrodes CEb1. In other words, the sensing line SL1 may be disposed between adjacent first common electrodes CEb1 in the sub-pixel SP. With the above configuration, even when the common voltage Vcom is applied to the sensing line SL1 and the first common electrodes CEb1, an electric field may be formed between the pixel electrodes PE.

Further, the sensing line SL1 may be spaced apart from the first common electrodes CEb1 in the second direction (Y-axis direction). For example, the sensing line SL1 may be located in an electric field area LC2. Thus, when the common voltage Vcom is applied to the sensing line SL1, the electric field area LC2 is present between the two first common electrodes CEb1 so that an aperture ratio is improved and an electric field may be easily formed between the pixel electrodes PE in the electric field area LC2.

The sensing line SL1 may be located between the pixel branch electrodes PEb. Further, the sensing line SL1 may not overlap the second common electrode CEb2 in the third direction (Z-axis direction).

In an aspect, the sub-pixel SP may include a first area S1 and a second area S2 which have different separation distances between adjacent second common electrodes CEb2. The first area S1 may be located between the adjacent second common electrodes CEb2 and may have a first separation distance dd1, and the second area S2 may be an area which is located between the adjacent second common electrodes CEb2 and has a second separation distance dd2. In this case, the first separation distance dd1 may be greater than the second separation distance dd2. Alternatively, the second separation distance dd2 may be smaller than the first separation distance dd1.

Further, the sensing line SL1 may be disposed in the first area S1. Thus, in the first area S1, the sensing line SL1 may be disposed between adjacent pixel branch electrodes PEb. With the above configuration, the sensing line SL1 may perform the same function as the second common electrode CEb2. That is, since the common voltage Vcom is applied to the sensing line SL1, the sensing line SL1 may form an electric field with an adjacent pixel branch electrode PEb. Consequently, the sensing line SL1 may be replaced with the second common electrode CEb2 to form an electric field and, simultaneously, perform a touch function. Further, since a second common voltage is partially removed between the adjacent pixel branch electrodes PEb, the display device according to the present aspect may provide improved transmittance.

Further, in an aspect, the sensing line SL1 may have the same separation distance with respect to the adjacent pixel branch electrodes PEb. The separation distance may be a length in the second direction (Y-axis direction). For example, the sensing line SL1 may be located at a center between the adjacent pixel branch electrodes PEb. Thus, the electric field may also be uniformly formed in association with the adjacent pixel branch electrodes PEb based on the sensing line SL1. Further, uniform transmittance of light may be achieved based on the sensing line SL1.

Figure 11:
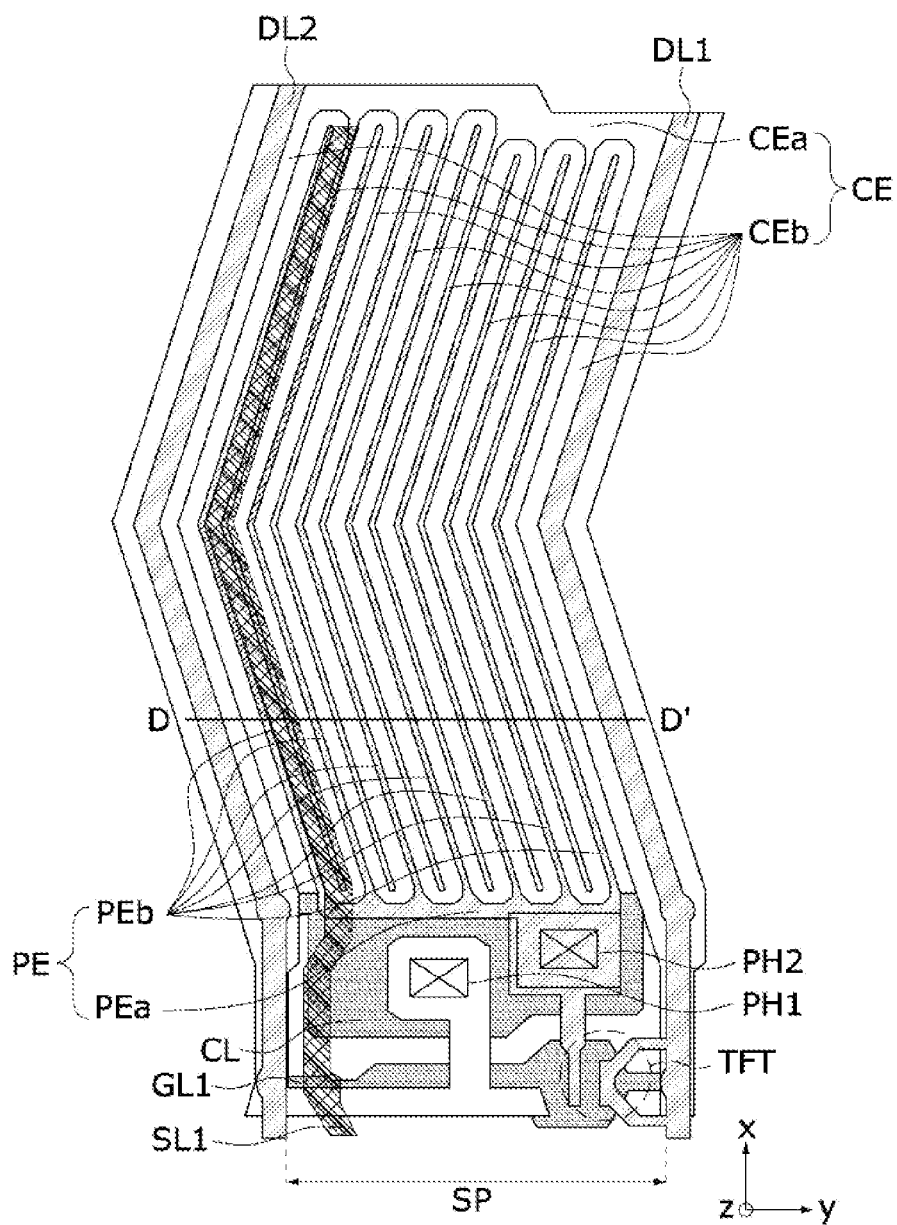
FIG. 11 is a plan view illustrating a sub-pixel of a display device according to a third aspect of the present disclosure.
Figure 12:
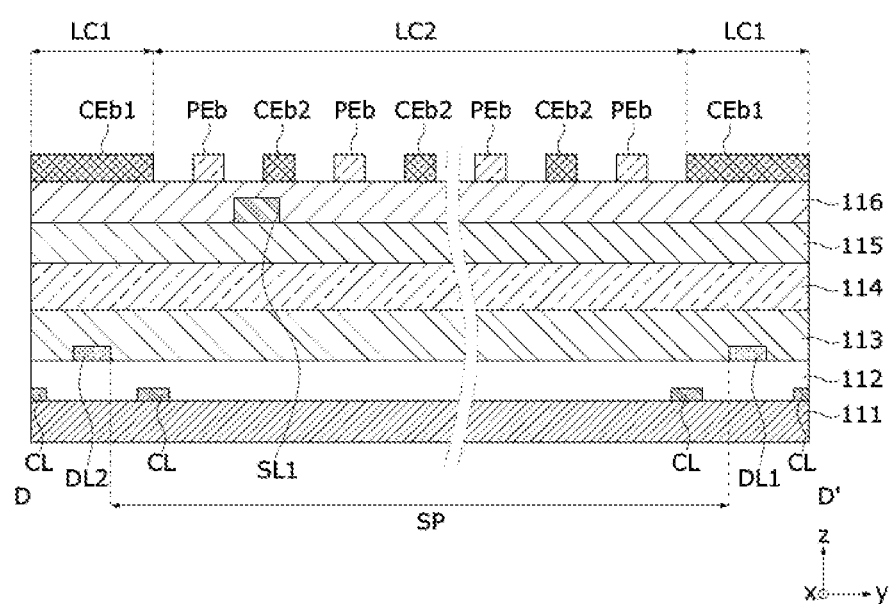
FIG. 12 is a cross-sectional view taken along line D-D' in FIG. 11.

FIG. 11 is a plan view illustrating a sub-pixel of a display device according to a third aspect of the present disclosure, and FIG. 12 is a cross-sectional view taken along line D-D' in FIG. 11.

Referring to FIGS. 11 and 12, as described above, even in a display device according to a third aspect of the present disclosure, a sub-pixel may be defined by a plurality of data lines extending in the first direction and a plurality of gate lines extending in the second direction. In a description of a direction, the above description may be equally applied to the present aspect.

A common line CL may be disposed to extend in the second direction (Y-axis direction). Further, the common line CL may be disposed in the above-described touch electrode TE. Thus, a common voltage Vcom may be applied to each touch electrode TE through the common line CL.

In an aspect, the common line CL may be electrically connected to a sensing line SL1. Further, the common line CL may also be electrically connected to a common electrode CE disposed in each sub-pixel SP. Thus, in the display mode, the common voltage Vcom may be applied from the sensing line SL1 to the common line CL in each touch electrode TE, and the common voltage Vcom may be applied to the common electrode CE in each sub-pixel SP along the common line CL.

In addition, in a touch mode, a touch driving signal may be applied from the sensing line SL1 to the common line CL in each touch electrode TE. Further, the touch driving signal may be transmitted to the common electrode CE along the common line CL. Accordingly, the touch driving signal may be applied to each of the plurality of touch electrodes TE, and a touch circuit may determine the presence and absence of a touch and touch coordinates using the touch driving signal (i.e., the touch sensing signal) which is modified due to a variation in self-capacitance resulting from a touch.

In addition, as described above, a gate line GL1 may be disposed to extend in the second direction (Y-axis direction). Further, data lines DL1 and DL2 may extend in the first direction (X-axis direction) different from a direction of the gate line GL1.

In the sub-pixel SP, a data line and a gate line, which are adjacent to each other, may be electrically connected by a TFT. In an aspect, a source electrode of the TFT may be electrically connected to an adjacent data line. In addition, a drain electrode of the TFT may be electrically connected to the pixel electrode PE in the sub-pixel SP. Further, a gate electrode of the TFT may be electrically connected to the gate line GL1. However, the present disclosure is not limited thereto, and the pixel electrode PE may be connected to the source electrode of the TFT.

Further, the sub-pixel SP may be formed of an opening area in which an image is displayed by the pixel electrode PE and the common electrode CE and a non-opening area in which an element (e.g., the TFT or the like) for driving the pixel electrode PE and the common electrode CE is disposed.

In the display mode, the pixel electrode PE may form an electric field together with the common electrode CE. Further, a liquid crystal may be tilted due to the formed electric field.

Further, the pixel electrode PE may include a plurality of pixel electrodes (hereinafter referred to as "pixel branch electrodes" PEb) extending in the first direction (X-axis direction) in parallel, and a pixel electrode (hereinafter referred to as a "pixel stem electrode" PEa) for connecting the pixel branch electrodes PEb which extend in the first direction.

The pixel stem electrode PEa may be electrically connected to the drain electrode of the above-described TFT. In an aspect, the pixel stem electrode PEa may be electrically connected to the drain electrode of the TFT through a second through-hole PH2. A description thereof will be made below.

Further, the pixel stem electrode PEa may be disposed to extend in the second direction (Y-axis direction) and electrically connected to the plurality of pixel branch electrodes PEb.

The pixel branch electrode PEb may extend in the first direction (X-axis direction) and may be provided as the plurality of pixel branch electrodes PEb. The pixel branch electrodes PEb may be disposed in parallel with the adjacent data lines DL1 and DL2. In addition, the pixel branch electrodes PEb may be disposed in parallel with common branch electrodes CEb which will be described below.

Further, the plurality of pixel branch electrodes PEb may be disposed to be spaced the same interval from an adjacent pixel branch electrode. Further, the pixel branch electrodes PEb may be alternately disposed with the common branch electrodes CEb in the second direction (Y-axis direction).

Further, the pixel electrode PE may be made of a conductive material. In an aspect, the pixel electrode PE may be made of a transparent conductive film. For example, the transparent conductive film may include a transparent and conductive material such as ITO or IZO.

The common electrode CE may include a plurality of common electrodes (hereinafter referred to as "common branch electrodes" CEb) extending in the first direction (X-axis direction) in parallel with each other, and a common electrode (hereinafter referred to as a "common stem electrode" CEa) for connecting the plurality of common branch electrodes CEb extending in the first direction (X-axis direction).

The common stem electrode CEa may be electrically connected to the common line CL. Further, since the common line CL is electrically connected to the sensing line SL1, the common stem electrode CEa may be electrically connected to the sensing line SL1. In FIG. 11, the sensing line SL1 being electrically connected to the common stem electrode CEa through a through-hole or the like is not illustrated. However, in the present disclosure, the common line CL may be electrically connected to the sensing line in another sub-pixel in each touch electrode TE, and the common line CL may extend to overlap the plurality of sub-pixels, which are disposed in the second direction (Y-axis direction), in the third direction so that the sensing line SL1 may be electrically connected to the common stem electrode CEa of the sub-pixel SP.

Further, the common stem electrode CEa may be disposed to extend in the second direction (Y-axis direction) and electrically connected to the plurality of common branch electrodes CEb.

The common branch electrode CEb may extend in the first direction (X-axis direction) and may be provided as the plurality of common branch electrodes CEb. The common branch electrodes CEb may be disposed in parallel with adjacent pixel branch electrodes PEb or adjacent data lines DL1 and DL2. Further, as described above, the common branch electrodes CEb may be alternately disposed in parallel with the pixel branch electrodes PEb.

In an aspect, the common branch electrodes CEb may be disposed to be spaced the same interval from an adjacent common branch electrodes CEb. However, the present disclosure is not limited thereto.

Further, the common branch electrodes CEb may be alternately disposed with the pixel branch electrodes PEb in the second direction (Y-axis direction).

Further, the common electrode CE may be made of a conductive material. In an aspect, the common electrode CE may be made of a transparent conductive film. For example, the transparent conductive film may include a transparent and conductive material such as ITO or IZO.

Further, the common electrode CE may be located coplanar with the pixel electrode PE. In an aspect, the common electrode CE may at least partially overlap the pixel electrode PE in the second direction (Y-axis direction). In addition, the common branch electrodes CEb may overlap the pixel branch electrodes PEb in the second direction (Y-axis direction).

Further, the display panel may be formed of a plurality of layers. The display panel may include a substrate 111, the common line CL and a gate line disposed on the substrate 111, a gate insulating layer 112 on the common line CL and the gate line, data lines DL1 and DL2 on the gate insulating layer 112, a first insulating layer 113 on the data lines DL1 and DL2, a filter layer 114 on the first insulating layer 113, a second insulating layer 115 on the filter layer 114, and a planarization layer 116 on the second insulating layer 115.

A TFT may be formed on the substrate 111. The substrate 111 may be made of various materials such as glass and the like.

The gate insulating layer 112 may electrically insulate the common line CL from an active layer (not shown). The data lines DL1 and DL2 may be disposed on the active layer (not shown). In addition, the gate insulating layer 112 may electrically insulate the common line CL from the data lines DL1 and DL2.

Further, a source electrode and a drain electrode spaced apart therefrom may be disposed on the active layer (not shown). Further, the active layer (not shown) may form a channel in a separation space between the source electrode and the drain electrode in an upper region corresponding to the gate line. The active layer (not shown) may be formed of any one of polycrystalline polysilicon, LTPS, and an oxide semiconductor.

Further, the gate insulating layer 112 may be formed of an insulating material such as a $SiO_x$ film, a $SiN_x$ film, or the like. Further, the gate insulating layer 112 may be formed of a transparent material. Further, the gate insulating layer 112 may be formed of a single layer or a multilayer.

Each of the common line CL, the data lines DL1 and DL2, and the gate line may be formed of any one selected from the group consisting of Mo, Al, Cr, Au, Ti, Ni, Nd, and Cu, or an alloy thereof.

Further, each of the source electrode and the drain electrode may also be made of any one selected from the group consisting of Mo, Al, Cr, Au, Ti, Ni, Nd, and Cu, or an alloy thereof.

The first insulating layer 113 may be located on the gate insulating layer 112. In addition, the first insulating layer 113 may be located on the data lines DL1 and DL2.

Further, the first insulating layer 113 may be formed of an insulating material such as a $SiO_x$ film, a $SiN_x$ film, or the like. Further, the first insulating layer 113 may be formed of a transparent material and made as a single layer or a multilayer.

Meanwhile, the source electrode and the drain electrode may be disposed on the first insulating layer 113.

The filter layer 114 may be disposed on the first insulating layer 113. The filter layer 114 may include a red color filter, a blue color filter, and a green color filter. Further, the filter layer 114 may have a structure in which the red color filter and the blue color filter are stacked so as to block light.

The second insulating layer 115 may be disposed on the filter layer 114. The second insulating layer 115 may be formed of an insulating material such as a $SiO_x$ film, a $SiN_x$ film, or the like. Further, the first insulating layer 113 may be formed of a transparent material and made as a single layer or a multilayer.

Further, the sensing line SL1 may be disposed on the second insulating layer 115.

The planarization layer 116 may be disposed on the second insulating layer 115. A top surface of the planarization layer 116 may be formed to be flat so as to remove a step formed in each layer below the planarization layer 116.

The planarization layer 116 may be formed of an organic material such as photo acryl, polyimide, benzocyclobutene resin, acrylate resin, or the like.

Further, it should be understood that the above-described contents may be applied to contents, which will be described in detail below, excluding the contents of the above-described components.

The common branch electrodes CEb may include first common electrodes CEb1 disposed at outermost sides and second common electrodes CEb2 disposed between the first common electrodes CEb1 at the outermost sides.

The first common electrodes CEb1 may be provided as two first common electrodes CEb1 in a single sub-pixel SP. Further, the first common electrode CEb1 may be disposed inside the two first common electrodes CEb1, and the two first common electrodes CEb1 may be spaced apart from the second common electrodes CEb2 in the second direction (Y-axis direction).

Further, as shown in the drawing, in the sub-pixel SP, the first common electrodes CEb1 may be disposed further toward an outer side than the pixel branch electrodes PEb. Alternatively, in the sub-pixel SP, the first common electrodes CEb1 may be disposed further toward an inner side than the pixel branch electrodes PEb. Hereinafter, a description will be made based on the drawings.

The sensing line SL1 may be located below the first common electrodes CEb1 and the second common electrodes CEb2. In an aspect, the sensing line SL1 may be spaced apart from the pixel electrode PE and the common electrode CE in the third direction (Z-axis direction).

Further, the sensing line SL1 may be disposed between the two first common electrodes CEb1. In other words, the sensing line SL1 may be disposed between adjacent first common electrodes CEb1 in the sub-pixel SP. With the above configuration, even when the common voltage Vcom is applied to the sensing line SL1 and the first common electrodes CEb1, an electric field may be formed between the pixel electrodes PE.

Further, the sensing line SL1 may be spaced apart from the first common electrodes CEb1 in the second direction (Y-axis direction). For example, the sensing line SL1 may be located in an electric field area LC2. Thus, when the common voltage Vcom is applied to the sensing line SL1, the electric field area LC2 is present between the two first common electrodes CEb1 so that an aperture ratio is improved and an electric field may be easily formed between the pixel electrodes PE in the electric field area LC2.

The sensing line SL1 may be located between the pixel branch electrodes PEb.

In an aspect, the sensing line SL1 may be disposed to partially overlap the second common electrode CEb2. Further, the second common electrode CEb2 may partially overlap the sensing line SL1 in the third direction (Z-axis direction). With the above configuration, it is possible to reduce blocking of light due to the sensing line SL1. That is, transmittance of the display device according to the present aspect may be improved.

Figure 13:
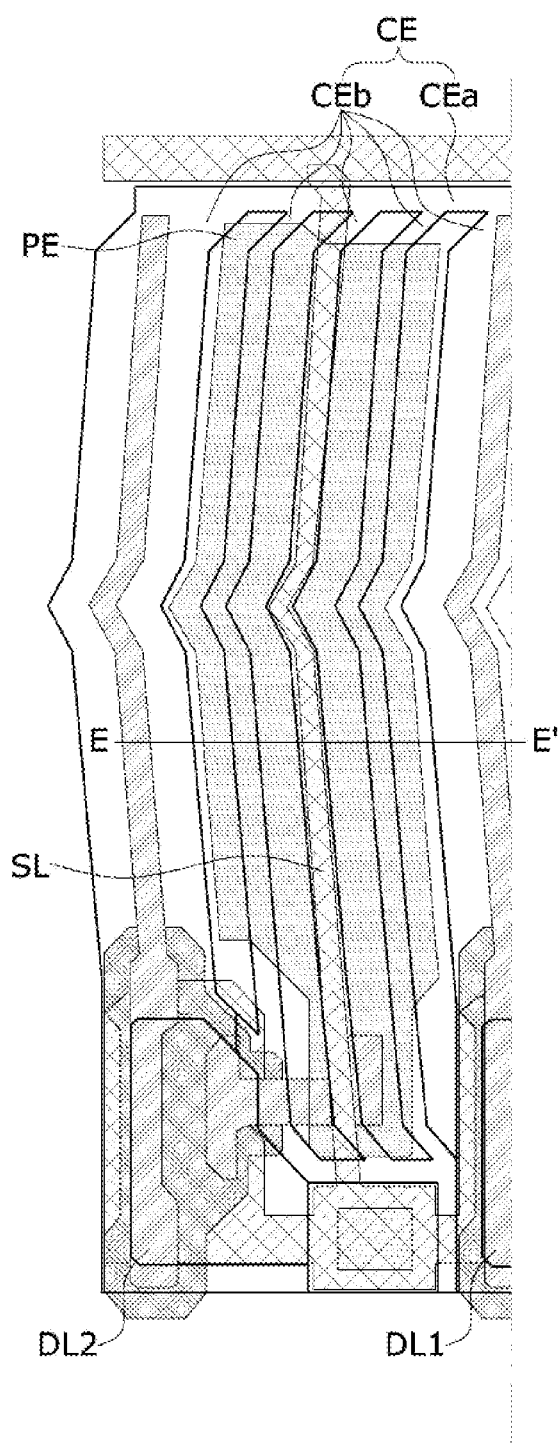
FIG. 13 is a plan view illustrating a sub-pixel of a display device according to a fourth aspect of the present disclosure.
Figure 14:
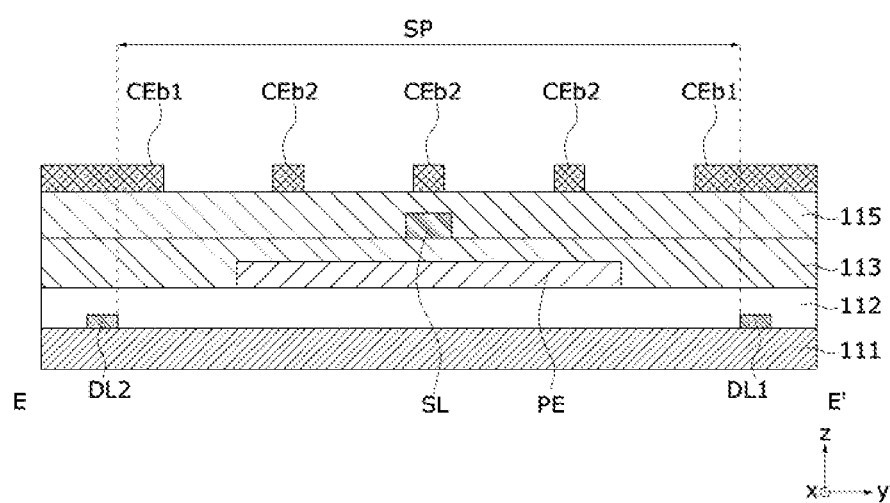
FIG. 14 is a cross-sectional view taken along line E-E' in FIG. 13.

FIG. 13 is a plan view illustrating a sub-pixel of a display device according to a fourth aspect of the present disclosure, and FIG. 14 is a cross-sectional view taken along line E-E' in FIG. 13.

Referring to FIGS. 13 and 14, in the display device according to the fourth aspect, a display panel may include a substrate 111, a gate insulating layer 112, a first insulating layer 113, and a second insulating layer 115. Further, the display device may include a common electrode CE, a pixel electrode PE, data lines DL1 and DL2, and a sensing line SL.

Further, it should be understood that the above-described contents may be applied to contents, which will be described in detail below, excluding the contents of the above-described components.

In an aspect, the pixel electrode PE and common electrode CE may be disposed in different layers. Alternatively, the pixel electrode PE may be spaced apart from the common electrode CE in the third direction (Z-axis direction). Thus, the pixel electrode PE may not overlap the common electrode CE in the second direction (Y-axis direction).

In addition, a sensing line SL may be disposed between two first common electrodes CEb1 in a sub-pixel SP. Further, the sensing line SL may at least partially overlap a second common electrode CEb2 in the third direction (Z-axis direction). With the above configuration, the sensing line SL may form an electric field between the pixel electrode PE and the sensing line SL and, simultaneously, improve transmittance.

Further, the sensing line SL may overlap the pixel electrode PE in the third direction (Z-axis direction). In an aspect, the pixel electrode PE may overlap the second common electrode CEb2. For example, the sensing line SL and the second common electrode CEb2 may be disposed on the pixel electrode PE. Therefore, as described above, in preparation for a case in which the sensing line SL is spaced apart from the pixel electrode PE, the sensing line SL may form an electric field between the pixel electrode PE and the sensing line SL and improve the transmittance.

Alternatively, the sensing line SL1 may be located at a center of the pixel electrode PE. In other words, the sensing line SL1 may bisect the pixel electrode PE overlapping the sensing line SL1. Thus, an electric field may also be uniformly formed in association with the pixel electrode PE based on the sensing line SL.

Alternatively, the sensing line SL may be located in the middle between adjacent first common electrodes CEb1 in the sub-pixel SP. Therefore, uniform transmittance of light may be achieved based on the sensing line SL.

According to the aspects of the present disclosure, it is possible to implement a display device including a touch function.

According to the aspects of the present disclosure, it is possible to manufacture a display device with an improved aperture ratio and improved transmittance by changing positions of a sensing line, a common electrode, and a pixel electrode.

Various beneficial advantages and effects of the present disclosure are not limited by the above description and should be easily understood through the description of the detailed aspects of the present disclosure.

Although the aspects of the present disclosure have been described in more detail with reference to the accompanying drawings, the present disclosure is not necessarily limited to these aspects and may be variously modified without departing from the technical spirit of the present disclosure. The aspects disclosed herein, therefore, are not to be taken in a sense of limiting the technical concept of the present disclosure but for explanation thereof, and the range of the technical concept of the present disclosure is not limited to these aspects. Therefore, it should be understood that the above-described aspects are not restrictive but illustrative in all aspects. The scope of the present disclosure should be construed by the appended claims along with the full range of equivalents to which such claims are entitled.

What is claimed is:

1. A display device comprising:
   a plurality of sub-pixels defined by a plurality of gate lines and a plurality of data lines;
   a pixel electrode disposed in each of the plurality of sub-pixels in a first direction;
   a common electrode disposed in each of the plurality of sub-pixels in the first direction; and
   a sensing line disposed in each of the plurality of sub-pixels in the first direction,
   wherein the common electrode includes a first common electrode disposed at an outermost side in a second direction that is perpendicular to the first direction, and
   wherein the sensing line is disposed between two adjacent first common electrodes.

2. The display device of claim 1, wherein the sensing line is disposed between two adjacent pixel electrodes.

3. The display device of claim 1, wherein the common electrode further includes a second common electrode disposed between the two adjacent first common electrodes.

4. The display device of claim 3, wherein the sensing line overlaps with the second common electrode in a third direction that is perpendicular to the first direction and the second direction.

5. The display device of claim 3, wherein each of the plurality of sub-pixels includes a first area having a first separation distance between two adjacent second common electrodes and a second area having a second separation distance that is smaller than the first separation distance between the two adjacent second common electrodes, and wherein the sensing line is disposed in the first area.

6. The display device of claim 5, wherein the sensing line does not overlap with the second common electrode in a third direction that is perpendicular to the first direction and the second direction.

7. The display device of claim 1, wherein the pixel electrode is spaced apart from the common electrode in a third direction that is perpendicular to the first direction and the second direction.

8. The display device of claim 1, wherein the sensing line overlaps with the common electrode and the pixel electrode in a third direction that is perpendicular to the first direction and the second direction.

9. The display device of claim 1, wherein the pixel electrode at least partially overlaps with the common electrode in the second direction.

10. A display device comprising:
a plurality of gate lines and a plurality of data lines crossing with one another;
a plurality of sub-pixels defined by the plurality of gate lines and the plurality of data lines;
a pixel electrode disposed in each of the plurality of sub-pixels in a first direction;
a first common electrode disposed at an outermost side of the plurality of sub-pixels in a second direction that is perpendicular to the first direction; and
a second common electrode disposed between the two adjacent first common electrodes;
a sensing line disposed in each of the plurality of sub-pixels in the first direction, and disposed between two adjacent first common electrodes.

11. The display device of claim 10, wherein the sensing line is disposed between two adjacent pixel electrodes.

12. The display device of claim 11, wherein the sensing line overlaps with the second common electrode in a third direction that is perpendicular to the first direction and the second direction.

13. The display device of claim 10, wherein each of the plurality of sub-pixels includes a first area having a first separation distance between two adjacent second common electrodes and a second area having a second separation distance that is smaller than the first separation distance between the two adjacent second common electrodes, and wherein the sensing line is disposed in the first area.

14. The display device of claim 13, wherein the sensing line does not overlap with the second common electrode in a third direction that is perpendicular to the first direction and the second direction.

15. The display device of claim 10, wherein the pixel electrode is spaced apart from the first common electrode in a third direction that is perpendicular to the first direction and the second direction.

16. The display device of claim 10, wherein the sensing line overlaps with the first common electrode and the pixel electrode in a third direction that is perpendicular to the first direction and the second direction.

17. The display device of claim 10, wherein the pixel electrode at least partially overlaps with the first common electrode in the second direction.

* * * * *